United States Patent [19]

Mizuishi et al.

[11] Patent Number: 5,089,239

[45] Date of Patent: Feb. 18, 1992

[54] WIRE VIBRATION PREVENTION MECHANISM FOR A SINGLE CRYSTAL PULLING APPARATUS

[75] Inventors: Koji Mizuishi; Isamu Harada, both of Annaka; Yasushi Nakamura, Tomioka; Michiaki Oda, Annaka; Seiichiro Ohtsuka, Tomioka; Yoshihiro Hirano, Annaka; Masahiko Urano, Takasaki, all of Japan

[73] Assignee: Shin-Etsu Handotai Co., Ltd., Tokyo, Japan

[21] Appl. No.: 509,846

[22] Filed: Apr. 17, 1990

[30] Foreign Application Priority Data

Apr. 18, 1989 [JP] Japan .................................. 1-96304
Apr. 26, 1989 [JP] Japan ............................... 1-48205[U]

[51] Int. Cl.⁵ .............................................. B01J 17/10
[52] U.S. Cl. ................................... 422/249; 422/248; 156/617.1; 156/DIG. 98
[58] Field of Search ............... 156/617.1, 618.1, 619.1, 156/620.7, DIG. 98; 422/248, 249

[56] References Cited

U.S. PATENT DOCUMENTS

| | | | |
|---|---|---|---|
| 4,045,278 | 8/1977 | Keller | 156/602 |
| 4,176,002 | 11/1977 | Quenisset et al. | 422/249 |
| 4,190,630 | 2/1980 | Apilat et al. | 422/249 |

FOREIGN PATENT DOCUMENTS

| | | | |
|---|---|---|---|
| 0065789 | 4/1985 | Japan | 422/249 |
| 1106489 | 5/1986 | Japan | 422/249 |

Primary Examiner—Olik Chaudhuri
Assistant Examiner—Felisa Garrett
Attorney, Agent, or Firm—Lowe, Price, LeBlanc & Becker

[57] ABSTRACT

A single crystal pulling apparatus having a wire which is used to pull a crystal is provided with a novel wire vibration prevention mechanism. The wire vibration prevention mechanism includes wire restriction devices which restrict the movement of the wire to movement in the vertical direction. The wire restriction devices may be mechanically driven in the horizontal direction in order to center the pulled crystal. The wire restriction devices are driven by pneumatic air cylinders. Use of the wire vibration prevention mechanism avoids the formation of deformed growth of the pulled crystal and thus reduces the occurrence of dislocations in the pulled crystal.

3 Claims, 6 Drawing Sheets

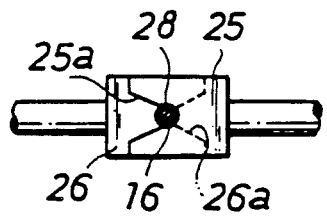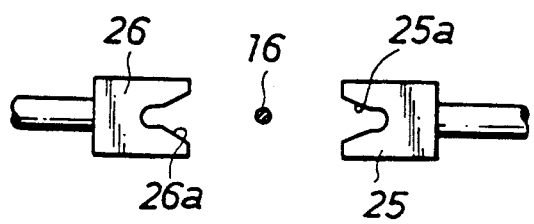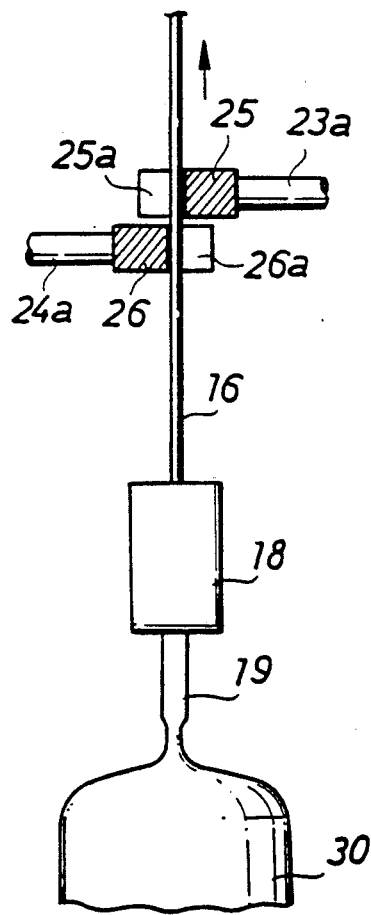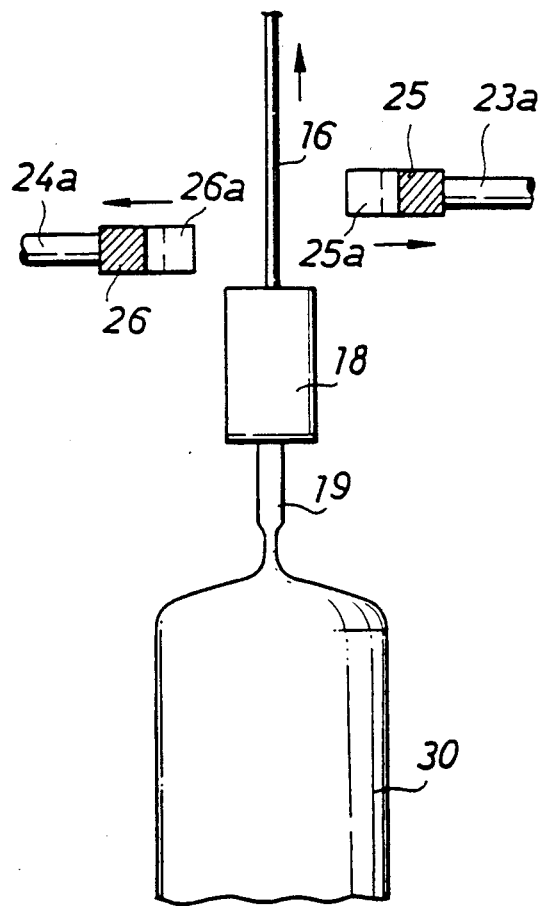

WIRE VIBRATION PREVENTION MECHANISM FOR A SINGLE CRYSTAL PULLING APPARATUS

BACKGROUND OF THE INVENTION

The present invention relates to a wire vibration prevention mechanism used in a single crystal pulling apparatus.

A single crystal pulling apparatus is designed to grow and pull up a single crystal rod (ingot) from a melt of a polycrystal substance based on the CZ method (Czochralski method). A conventional single crystal pulling apparatus consists mainly of a main chamber, and in this chamber are a crucible for containing the polycrystal substance (raw material) to be crystallized, a heater surrounding the crucible to melt down the polycrystal substance, a thermal insulator surrounding the heater, etc. The crucible is fixedly mounted on a vertical shaft which is adapted to rotate about its axis. Above the main chamber is provided a pull chamber from which the single crystal ingot pulled up from the main chamber is removed.

In the conventional single crystal pulling apparatus, the as-grown single crystal ingot is connected to and pulled up by a vertical shaft (pull shaft) which is in coaxial alignment with the crucible, and which is adapted to ascend vertically in the pull chamber. More exactly, a seed crystal held at the lower end of the pull shaft is dipped in the molten polycrystal substance in the crucible, and the single crystal grows from the seed crystal as the pull shaft is rotated and raised together with the seed crystal. However, in order to improve the yield of the single crystal ingot from which semiconductor chips are manufactured, the current tendency is to increase the size of the single crystal ingot pulled up in the CZ method. This has necessitated enlargement of the single crystal pulling apparatus, especially in the vertical dimension, as well as complication of the apparatus, so that in most of the newly designed apparatuses the rigid pull shaft is replaced by a wire which can be rolled up on a reel. In this way it is possible to avoid enlargement of the conventional pulling apparatus.

However, since the wire is flexible and tensed in use, it is liable to vibrate in response to an external driving force, especially to an external periodic driving force such as the rotational torque given by a drive means to rotate the wire. The amplitude of the wire vibration becomes large when the wire resonates as the natural free oscillation frequency (eigenfrequency) of the wire, which varies as a function of the free length of the wire, becomes equal to the rotational frequency (hereinafter "rotation speed") of the wire. The vibrating wire transmits the vibration to the suspended single crystal being grown to thereby cause deformed growth of the crystal and makes it difficult to obtain a dislocation-free single crystal ingot. Also, it is known that the distribution uniformity of electric resistivity and that of oxygen density across a cross section of the single crystal ingot depend on the rotation speed of the wire being driven by the drive means. If the optimum rotation speed of the wire for uniform crystallization is equal to or higher than the starting natural free oscillation frequency of the wire, which increases as the free length of the wire shortens, the undesirable resonance of the wire is unavoidable which occurs when the rotation speed and the natural free oscillation frequency of the wire become equal to each other. Therefore, in the conventional single crystal pulling apparatus in which a pull wire is adopted, a compromise had always to be made such that the pull wire was rotated at a rotation speed lower than the optimum value, so that it was difficult to improve the distribution uniformity of electric resistivity and oxygen density across a cross section of the single crystal ingot.

For this reason, various mechanisms have been proposed for prevention of vibration of the pull wire by restricting or bracing the wire at the middle portion of the free length of the wire. For example, Japanese Provisional Patent Publication (Kokai) No. 58-96591 teaches a mechanism for preventing vibration of a flexible pull means consisting essentially of a guide (restriction means) surrounding the pull shaft at a location above a seed chuck, a guide means for holding the guide in a manner such that the guide can move only in the direction parallel to the pull shaft, and a drive means to cause the guide to move along the guide means. Japanese Utility Model Publication No. 62-26458 teaches a single crystal silicon pulling apparatus consisting essentially of a main chamber, a crucible, and a flexible pull means (e.g., wire) carrying a seed crystal at the lower end, and characterized by further having a support means provided at a height corresponding to the middle portion of the free length of the flexible pull means, and a guide means (restriction means) consisting of a ring body held by said support means in a manner such that the ring body can be detached and raised from the support means and a tubular body fixed in the middle of the ring body via support rods and surrounding the flexible pull means.

However, in these proposed mechanisms for preventing vibration of the pull wire, the wire restriction means for restricting the middle portion of the free length of the wire is not adapted to move horizontally, so that it is not possible to correct the departure (deviation) of the restriction point from the axis of rotation of the crucible, which occurs when the single crystal pulling apparatus is deformed in an operational mode by heat, and which causes the single crystal ingot being pulled up to whirl about the imaginary static position and fail to grow in good shape or in dislocation-free manner.

SUMMARY OF THE INVENTION

The invention was made with the view of solving these problems, and it is therefore an object of the invention to provide a wire vibration prevention mechanism used in a single crystal pulling apparatus, which mechanism is capable of not only preventing the wire vibration due to resonance but also restoring the wire restriction point to coincide with the axis of rotation of the crucible when the restriction point departs from the axis as the single crystal pulling apparatus, especially the chambers, is thermally deformed, thereby facilitating normal crystallization.

In order to attain the above and other objects of the invention, an improved wire vibration prevention mechanism is provided, which is useful in a single crystal pulling apparatus of Czochralski-type having a lower heating chamber and an upper pull chamber adapted to obtain a single crystal ingot by pulling up a seed crystal fixed at the lower end of a wire from a polycrystal molten liquid contained in a crucible provided in the heating chamber. This wire vibration prevention mechanism comprises:

at least one wire restriction means provided in the pull chamber for singly or cooperatively restricting the wire to moving only in the vertical direction at the restricted portion which is about the middle of the free length of the wire (initial free length of the wire is the free length of the wire as of the start of the pulling operation); and as many drive means as the wire restriction means for horizontally displacing the respective wire restriction means.

In a preferred embodiment of the invention, the wire vibration prevention mechanism consists of:

two wire restriction means (25, 26) which each have semi-circular cylindrical dents, and are disposed to cooperatively define, with the dents, a circular cylindrical space (28) having a diameter barely greater than the diameter of the wire for capturing the middle portion of the initial free length of the wire therein; and two air cylinders (23, 24) as the drive means diametrically opposed to each other for displacing the respective wire restriction means fixed at the ends of the respective piston rods (23a, 24a) of the air cylinders, along a horizontal direction intersecting the wire.

In another preferred embodiment of the invention, the wire vibration prevention mechanism consists of:

one wire restriction means made up of an incompletely closed ring body (40a) having a vertically penetrating space defined therein which consists of a downwardly tapered truncated-conical bore (40a-1) and a vertical slit (40a-2) wider than the diameter of the wire, a truncated-conical body (40b) having a vertically penetrating hole (40b-1) of a diameter barely greater than the diameter of the wire passed therethrough, and adapted to fit in the truncated-conical bore (40a-1) of the ring body (40a), and a stopper body (41) fixed on the wire (16) at a location below the truncated-conical body and in the vicinity of the seed crystal, which stopper body has a width substantially greater than the diameter of the penetrating hole (40b-1) of the truncated-conical body; and one air cylinder (23) as the drive means for displacing the incompletely closed ring body (40a) of the wire restriction means which is fixed at the end of the piston rod of the air cylinder in a horizontal direction which intersects the wire.

According to the invention, since the middle portion of the wire is restricted by the wire restriction means, the free length of the wire is substantially decreased, and thus the natural oscillation frequency of the free length of the wire is substantially increased, whereby it becomes possible to increase the rotation speed of the wire (single crystal rod) beyond the conventional resonance-revoking critical frequency without provoking resonance. As a result, it is possible to set the rotation speed of the wire to an optimum value which gives the best results in the distribution uniformity of electric resistivity and oxygen density across a cross section of the single crystal ingot.

In addition to attaining this effect like the conventional wire vibration prevention mechanisms, the present inventive mechanism is adapted to correct the deviation of the restriction point from the axis of rotation of the crucible, which occurs when the single crystal pulling apparatus is deformed by heat in operational mode, so that it is possible to prevent whirling of the single crystal ingot being pulled up about the imaginary static position. Hence the single crystal ingot manufactured in the single crystal pulling apparatus equipped with the inventive wire vibration prevention mechanism will have little dislocation and other defects, and will have a nearly perfect circular cylindrical form.

BRIEF DESCRIPTION OF THE DRAWINGS

The present invention will become more fully understood from the detailed description given hereinbelow and the accompanying drawings which are given by way of illustration only, and thus are not limitative of the present invention and wherein:

FIG. 2 is a plan view of the same wire vibration prevention mechanism of FIG. 1, useful for explanation of the construction and operation of the same mechanism;

FIG. 3 is a fragmentary sectional side view of the the same wire vibration prevention mechanism of FIG. 1, useful for explanation of the construction and operation of the same mechanism;

FIG. 4 is a plan view similar to FIG. 2;

FIG. 5 is a fragmentary sectional side view similar to FIG. 3;

DETAILED DESCRIPTION OF PREFERRED EMBODIMENTS

Embodiments of the invention will be described with reference to attached drawings.

First Embodiment

Figure 1:
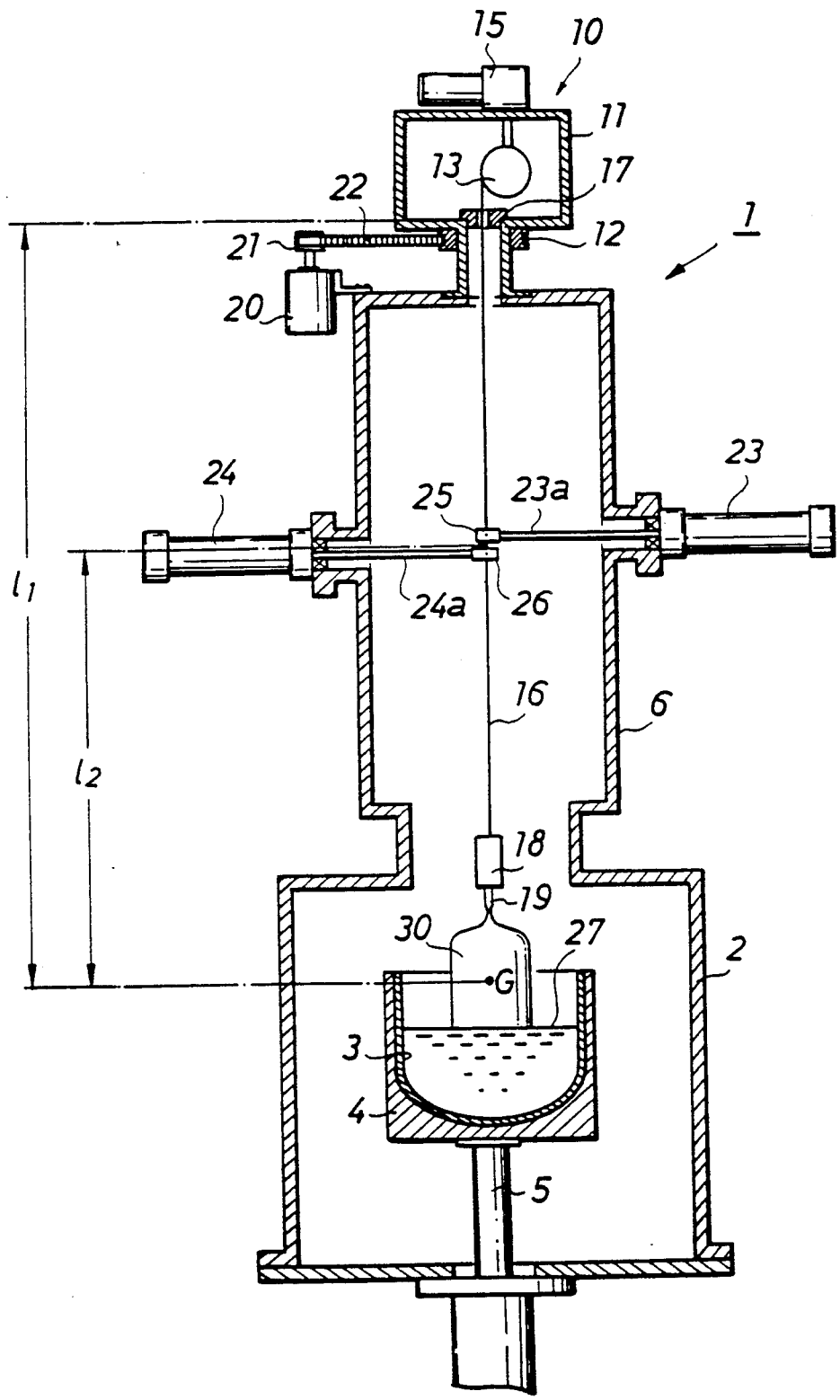
FIG. 1 is a vertical longitudinal sectional view of a single crystal pulling apparatus equipped with a wire vibration prevention mechanism according to a first embodiment of the invention.

FIG. 1 is a vertical longitudinal sectional view of a single crystal pulling apparatus equipped with a wire vibration prevention mechanism according to a first embodiment of the invention. FIGS. 2 through 5 are drawings useful for explanation of the construction and operation of the same wire vibration prevention mechanism, of which FIGS. 2 and 4 are plan views and FIGS. 3 and 5 are fragmentary sectional side views of the wire vibration prevention mechanism.

First, with reference to FIG. 1 the general construction of a single crystal pulling apparatus 1 will be explained. The reference numeral 2 designates a main chamber (lower heat chamber) which comprises generally a cylindrical tank made of stainless steel. Inside the main chamber 2 are a crucible assembly which consists of an internal crucible 3 of quartz and an external crucible 4 of graphite. This crucible assembly is fixed on top of a support shaft 5, which is adapted to turn about its axis driven by a drive means not shown. Other things which are provided within the main chamber 2, but are not shown in FIG. 1 for simplicity, include a cylindrical heater of carbon surrounding the crucibles, and a cylindrical thermal insulator also made of carbon and surrounding the heater.

Above the main chamber 2 is provided a pull chamber (upper chamber) 6 which comprises an elongate cylindrical body made of stainless steel. This pull chamber 6, the main chamber 2, the crucibles 3, 4, and the support shaft 5 are all coaxially aligned. Above the pull chamber 6 is provided a winding assembly 10 which mainly consists of a cylindrical box 11, which is also coaxial with the cylindrical members already mentioned. The box 11 has an elongate leg portion extending from the box bottom, and this leg portion is slidable resting on the top of the pull chamber 6 so that the box 11 can rotate about its axis. The direction of rotation of the box 11 is always opposite to that of the crucibles below. A pulley 12 is fixed about the leg portion of and beneath the bottom of the box 11. A wire take-up drum 13 is fixedly suspended in the box 11 and is adapted to be driven by an electric motor 15 which is installed on the top of the box 11.

A wire 16 is wound about the wire take-up drum 13, and, in FIG. 1, a part of the wire 16 is unwound, which vertically falls passing through a wire support ring 17 provided in the box 11. It is so arranged that the thus lowered wire 16 coincides with the center line of the single crystal pulling apparatus 1. A seed holder 18 is provided at the lower end of the wire 16, and a seed crystal 19 is held vertically by the seed holder 18.

An electric motor 20 is fixed at a shoulder edge of the pull chamber 6 in a manner such that its output shaft extends vertically upward. A pulley 21 is fixed at the end of the output shaft of the motor 20, and an endless belt 22 is horizontally passed about the two pulleys 12 and 21, as shown in FIG. 1.

Now, in the present embodiment, two flanges of the same dimension are formed to protrude from the side of the pull chamber 6 at a location about the middle of the vertical length of the pull chamber 6 and these two flanges are located diametrically opposite to each other across the pull chamber 6. Two air cylinders 23, 24 are affixed to the pull chamber 6 via these flanges, and are adapted to controllably reciprocate their respective piston rods 23a, 24a through horizontal strokes which intersect the center line of the pull chamber 6. Wire braces 25, 26 are respectively provided at the ends of the piston rods 23a, 24a. Although these air cylinders 23, 24 are diametrically opposed to each other, the air cylinder 23 is located a little higher than the air cylinder 24 so that the respective wire braces 25, 26 do not interfere with each other when the piston rods 23a and 24a are pushed out extensively. Wire braces 25, 26 each have a dent 25a, 26a which is in the shape of a letter "V", when viewed from above, except that the innermost of the V dent is rounded to form a semicircular cylinder (ref. FIG. 4) which has a diameter slightly greater than the diameter of the wire 16.

Now, the operation procedure of this embodiment will be described with reference to FIGS. 1 through 5. The interior of the single crystal pulling apparatus 1 is filled with an inert gas such as Ar gas. The reference numeral 27 designates a molten polycrystal substance, e.g. silicon, which is prepared by melting the polycrystal substance in the crucible 3 by the heater. The motor 15 is started to turn the wire take-up drum 13 in a direction to unwind the wire 16 whereby the wire 16 is lowered. When the seed crystal 19 held by the seed holder 18 fixed at the lower end of the wire 16 is dipped partially in the melt 27 in the crucible 3, the motor 15 is stopped. At this time, the air cylinders 23 and 24 are driven to push out a predetermined amount of the respective piston rods 23a, 24a such that the wire braces 25 and 26 overlap each other to the extent that the rounded innermost recesses of the dents 25a and 26a cooperatively form a vertically penetrating circular hole 28 which is observed when seen from above, as shown in FIG. 2. Now, on this occasion, since the wire 16 coincides with the center line of the pull chamber 6, and the strokes of the rods 23a and 24a intersect the center line of the pull chamber 6, it follows that a middle portion of the suspending wire 16 is braced between the wire braces 25, 26 and passes through the small circular hole 28 formed by the dents 25a, 26a, whereby it is not possible for the wire 16 to vibrate or swing, being steadied at the braced middle portion of it (restriction point).

Then, the support shaft 5 is driven to rotate together with the crucibles 3, 4, and also the motor 20 is started to rotate the pulley 21, which in turn drives the belt 22 to thereby rotate the pulley 12 together with the box 11. It is arranged such that the direction of the rotation of the box 11 is opposite to that of the crucibles 3, 4. As the box 11 rotates about its axis of rotation, the wire 16 also turns at a predetermined desired rotation speed (frequency), without departing from the center line of the single crystal pulling apparatus 1 if the whole apparatus 1 is not caused to deform by heat. At the same time as the starting of the motor 20, the motor 15 is also started to cause the wire take-up drum 13 to start taking up the wire 16 at a predetermined rate. Thus, as the rotating wire 16 is raised, the seed crystal 19 picks up a single crystal rod 30 which grows therefrom downwardly, as shown in FIG. 1.

Supposing that the distance between the center of gravity G of the single crystal rod 30 and the wire support ring 17 is $l_1$ and that the distance between the center of gravity G and the restriction point of the wire 16 where the wire 16 is braced by the wire braces 25, 26 is $l_2$, which is smaller than $l_1$, then the resonance frequency $f_1$ of the wire 16 in the case where the wire vibration prevention mechanism is not used is given by the following equation (1):

$$f_1 = \frac{1}{2\pi}(g/l_1)^{\frac{1}{2}}, \quad (1)$$

wherein g is the gravitational acceleration. On the other hand, in the case of the present embodiment where the wire vibration prevention mechanism is used, the resonance frequency $f_2$ of the wire 16 is given by the following equation (2):

$$f_2 = \frac{1}{2\pi} (g/l_2)^{\frac{1}{2}}. \quad (2)$$

Since $l_2$ is smaller than $l_1$, $f_2$ becomes greater than $f_1$. Therefore, like the conventional wire vibration prevention mechanisms, by employing the wire vibration prevention mechanism of the present invention, it is possible to prevent the vibration of the wire 16 as well as to choose a higher rotation speed for the wire 16 (single crystal rod 30) because the critical rotation speed which causes resonance is increased. Consequently, the distribution uniformity in electric resistivity and oxygen density across a cross section of the single crystal ingot 30 is improved. Incidentally, since the distances $l_1$ and $l_2$ change with time, the resonance frequencies $f_1$ and $f_2$ also vary with time.

Now, as the pulling operation of the single crystal ingot 30 goes on, the seed holder 18 approaches the wire braces 25, 26, as shown in FIG. 3. In order to avoid interference of the wire braces 25, 26 with the rising seed holder 18, the air cylinders 23 and 24 are driven to withdraw the piston rods 23a, 24a sufficiently to thereby clear the passage for the seed holder 18 and the single crystal ingot 30, as shown in FIG. 5. As a result, the seed holder 18 and the single crystal ingot 30 ascend without being interfered with by the wire braces 25, 26, so that eventually the single crystal ingot 30 is brought up into the pull chamber and removed therefrom.

In the present embodiment, the air cylinders 23, 24 can cooperate to controllably displace the restriction point of the wire 16 in the horizontal direction by shifting the wire braces 25, 26. Therefore, when the main chamber 2 and the pull chamber 6 are thermally deformed and consequently the brace point of the wire 16 braced by the wire braces 25, 26 departs from the axis of rotation of the crucibles 3, 4 and the wire 16 starts whirling about its static position, tracing a locus akin to circular cone, it is possible to restore the restriction point of the wire 16 to the axis of rotation of the crucibles 3, 4 by shifting the wire braces 25, 26 in the direction of reducing the whirling motion of the wire 16. Thus, the inconveniences such as whirling of the single crystal rod 30 during the ingot pulling up operation are solved, whereby desirable crystal growth can be stably attained.

Incidentally, the thermal deformation of the chambers also causes the axis of the wire take-up dram 13 to slant from its horizontal position to thereby make the wire 16 to depart from the axis of rotation of the crucibles 3, 4. This deviation is corrected by appropriately turning a level bolt provided in the wire take-up dram 13 during the operation, or even prior to the single crystal pulling operation based on the anticipated amount of the deviation which is known from experience.

The material for the wire braces is preferably something that does not produce powder when scoured by the wire 16 and the purity of the material of which the wire braces are made should be high so that as small amounts of contaminants as possible should enter the melt.

Second Embodiment

Figure 6:
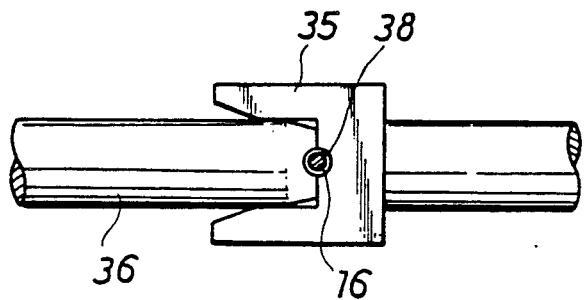
FIG. 6 is a plan view of a wire vibration prevention mechanism according to a second embodiment of the invention.
Figure 7:
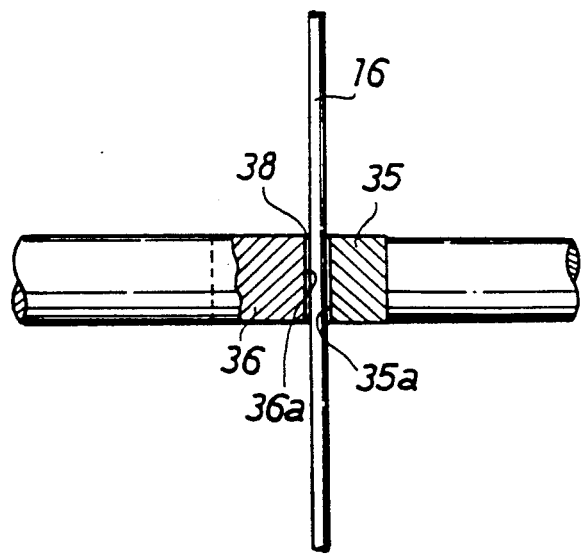
FIG. 7 is a fragmentary sectional side view of the same wire vibration prevention mechanism of FIG. 6.

Although in the first embodiment of the wire vibration prevention mechanism, the wire braces 25, 26 are disposed to lie in the different levels so that they overlap each other when they come across with each other, it is also possible to arrange the wire vibration prevention mechanism in a manner as shown in FIGS. 6 and 7 in which the wire braces 35, 36 lie in the same level so that they squarely come in contact with each other as they meet in the center. The wire braces 35, 36 respectively have recesses 35a and 36a which are semicircular when viewed from above, and when the wire braces 35 and 36 are in contact with each other, these semicircular recesses cooperate to form a circular cylindrical penetrating hole 38, through which the wire 16 passes.

Next, a third embodiment of the invention will be described with reference to FIGS. 8 through 14.

Third Embodiment

Figure 8:
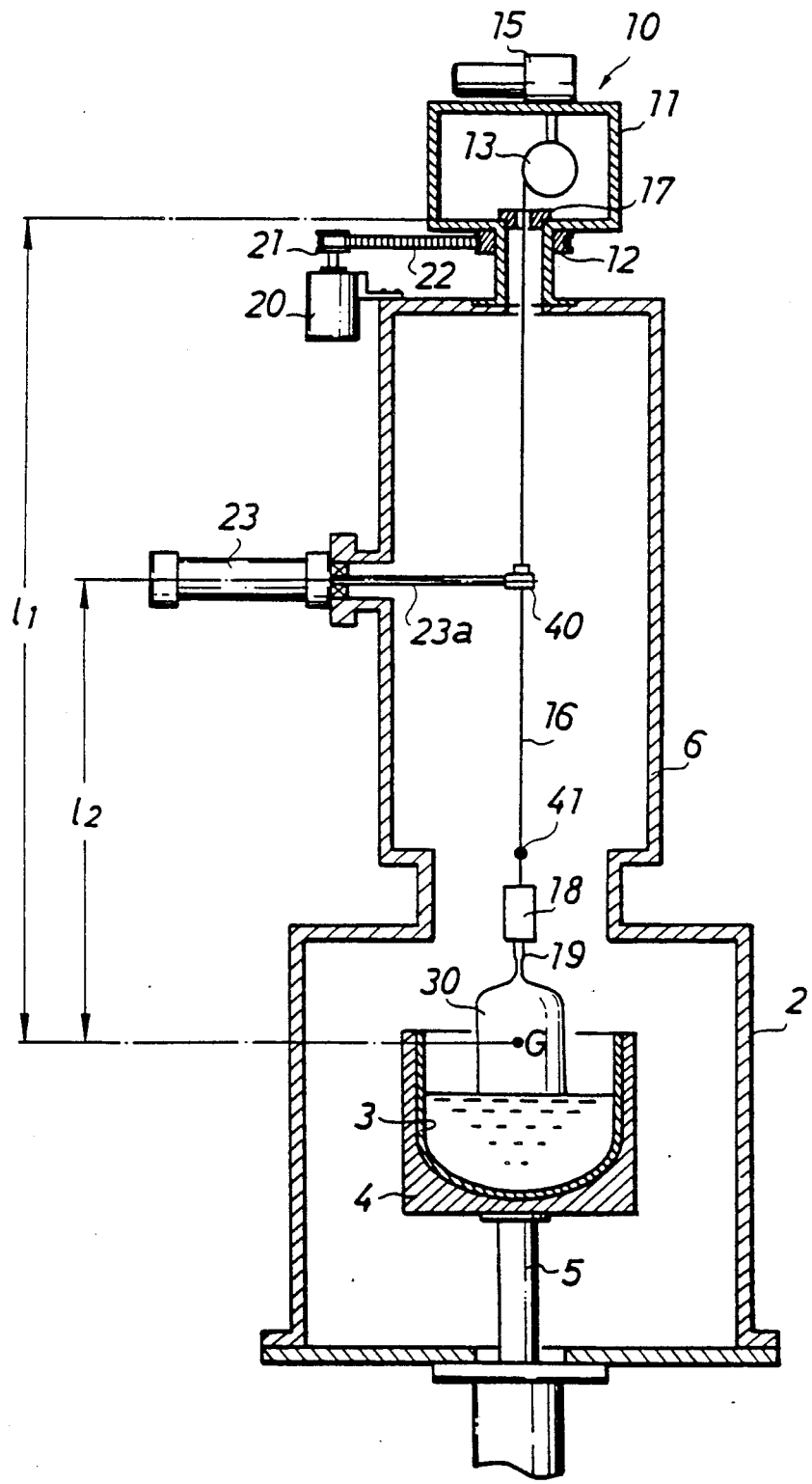
FIG. 8 is a vertical longitudinal sectional view of a single crystal pulling apparatus equipped with a wire vibration prevention mechanism according to a third embodiment of the invention.
Figure 9:
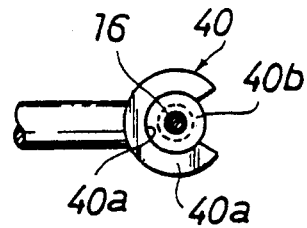
FIG. 9 is a plan view of the same wire vibration prevention mechanism of FIG. 8, useful for explanation of the construction and operation of the same mechanism.
Figure 13:
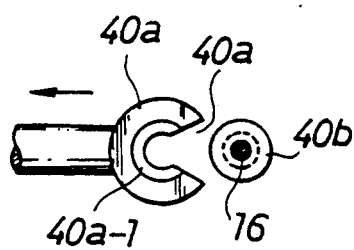
FIG. 13 is a plan view similar to FIG. 9.

FIG. 8 is a vertical longitudinal sectional view of a single crystal pulling apparatus equipped with a wire vibration prevention mechanism according to a third embodiment of the invention. FIGS. 9 through 14 are drawings useful for explanation of the construction and operation of the same wire vibration prevention mechanism, of which FIGS. 9 and 13 are plan views and FIGS. 10, 11, 12, and 14 are fragmentary sectional side views of the wire vibration prevention mechanism. In FIG. 8 and the subsequent FIGURES, the elements which have the similar dimensions and functions as their counterparts in FIG. 1 are designated by the like reference numerals, such as the crucibles 3, 4 and the pull chamber 6, and the description of those elements are omitted here to avoid the repetition. The description of the elements which are not included in FIG. 1 follows.

In this third embodiment, only one flange is formed to protrude from the side of the pull chamber 6 at a location about the middle of the vertical length of the pull chamber 6, and an air cylinder 23 is affixed to the pull chamber 6 via this flange. The air cylinder 23 is adapted to controllably reciprocate its piston rods 23a through a horizontal stroke which intersects the center line of the pull chamber 6. A wire brace 40 is provided at the free end of the piston rod 23a.

Figure 10:
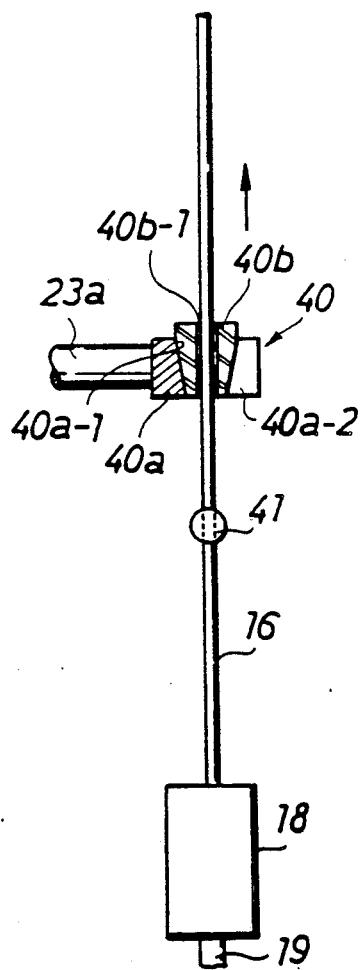
FIG. 10 is a fragmentary sectional side view of the same wire vibration prevention mechanism of FIG. 8, useful for explanation of the construction and operation of the same mechanism.

As is shown in detail in FIGS. 9 and 10, the wire brace 40 firstly consists of a main body 40a having a contour which looks like a letter "C" when seen from above. A tapered semi-hole 40a-1 is made vertically through the main body 40a and opening sideways through a tapered cutout opening 40a-2, which is cut out at a location remotest from the air cylinder 23 and serves as a wire escape. The semi-hole 40a-1 has a shape of a truncated cone and narrows downwardly. Another constituting element of the wire brace 40 is a truncated-conical slider 40b which is designed to fit in the tapered semi-hole 40a-1, and has a vertically penetrating hole 40b-1 in the center, through which the wire 16 is passed so that the slider 40b can slide freely along the wire 16. In FIG. 10, the slider 40b is fitted in the semi-hole 40a-1, and in this posture the wire brace 40 braces the middle portion of the free length of the wire 16 which is passed through the hole 40b-1 (FIG. 8).

A spherical stopper 41 is fixed on the wire 16 at a location above the seed holder 18 but below the slider 40b. The diameter of the spherical stopper 41 is greater than the diameter of the penetrating hole 40b-1 made in the slider 40b.

Now, the operation procedure of this embodiment will be described with reference to FIGS. 8 through 14. The interior of the single crystal pulling apparatus 1 is filled with an inert gas such as Ar gas. The motor 15 is started to turn the wire take-up drum 13 in a direction to unwind the wire 16 whereby the wire 16 is lowered, and the seed crystal 19 held by the seed holder 18 fixed at the lower end of the wire 16 is dipped partially in the melt 27 in the crucible 3. At this time, the wire brace 40 is bracing a middle portion of the suspending wire 16, whereby it is made impossible for the wire 16 to vibrate or swing at the restricted middle portion of it.

Then, the support shaft 5 is driven to rotate together with the crucibles 3, 4, and also the motor 20 is started to rotate the pulley 21, which in turn drives the belt 22 to thereby rotate the pulley 12 together with the box 11. As the box 11 rotates about its axis of rotation, the wire 16 also turns at a predetermined desired frequency. At the same time as the starting of the motor 20, the motor 15 is also started to cause the wire take-up drum 13 to start taking up the wire 16 at a predetermined rate. Thus, as the rotating wire 16 is raised, the seed crystal 19 raises a single crystal rod 30 which grows therefrom downwardly, as shown in FIG. 8.

For the same reason as discussed earlier in connection with the equations (1) and (2), it is possible to prevent the vibration of the wire 16 as well as to choose a higher rotational frequency for the wire 16 (single crystal rod 30) like the conventional wire vibration prevention mechanisms, by employing the wire vibration prevention mechanism of the present invention, because the critical rotational frequency is increased. Consequently, the uniformity in electric resistance and oxygen density across a cross section of the single crystal ingot 30 is improved.

Figure 11:
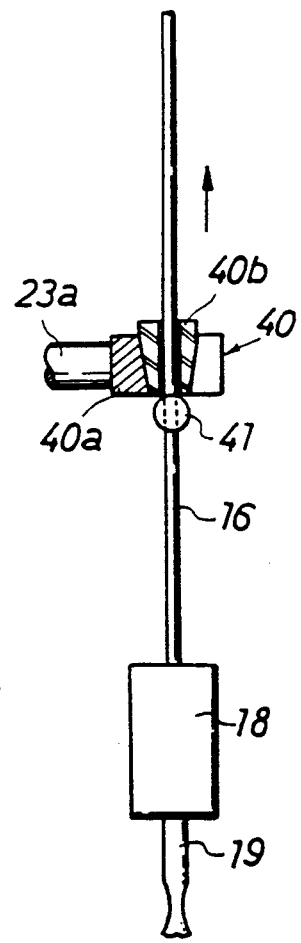
FIG. 11 is a fragmentary sectional side view similar to FIG. 10.
Figure 12:
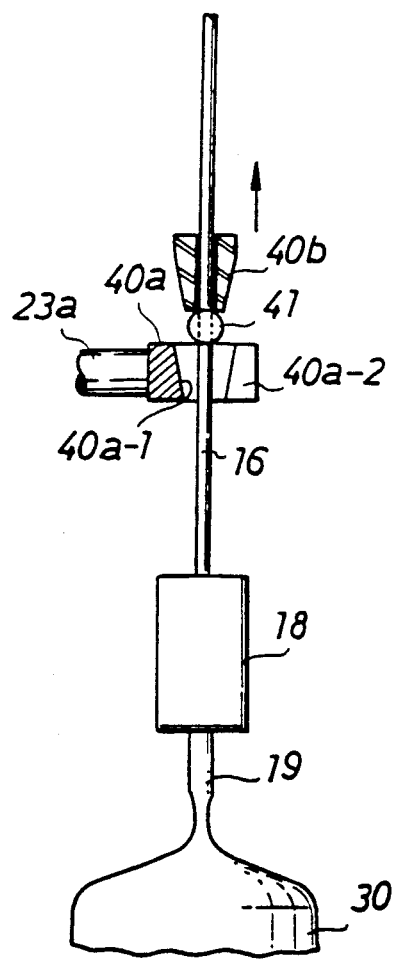
FIG. 12 is a fragmentary sectional side view similar to FIG. 10.
Figure 14:
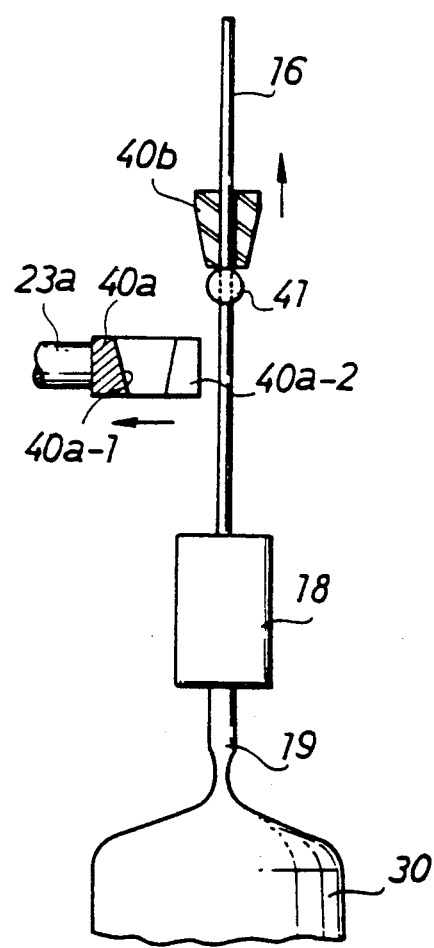
FIG. 14 is a fragmentary sectional side view similar to FIG. 10.

Now, as the pulling of the single crystal ingot 30 proceeds (FIG. 10), the stopper 41 gets in contact with the bottom of the slider 40b of the wire brace 40, as shown in FIG. 11, and further pull-up of the wire 16 forces the stopper 41 to detach the slider 40b from the main body 40a whereby the stopper 41 and the slider 40b rise up in one body, as shown in FIG. 12. At this instant, the wire 16 ceases to be braced by wire brace 40. Thereafter, as shown in FIG. 14, the air cylinder 23 is driven to withdraw the piston rod 23a together with the main body 40a so as to avoid interference of the wire braces 40 with the rising seed holder 18. Incidentally, the withdrawal of the brace main body 40a is possible by virtue of the cutout opening 40a-2. As a result, the seed holder 18 and the single crystal ingot 30 ascend without being interfered with by the wire brace 40, so that eventually the single crystal ingot 30 is brought up into the pull chamber and removed therefrom.

Although in the above embodiments, the number of the air cylinders is one or two, it is possible to provide more air cylinders and to thereby brace the middle portion of the wire at more than one brace points.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. In a Czochralski-type single crystal pulling apparatus, which has a lower heating chamber and an upper pull chamber, and is adapted to obtain a single crystal ingot by pulling up a seed crystal fixed at the lower end of a wire from a polycrystal molten liquid contained in a crucible provided in the heating chamber, an improved wire vibration prevention mechanism comprising:
    at least one wire restriction means provided in the pull chamber for singly or cooperatively restricting the wire to moving in the vertical direction at the restricted portion which is about the middle of the initial free length of the wire; and
    as many drive means as the wire restriction means for horizontally displacing the restrictive wire restriction means, said drive means comprising air cylinders.

2. A wire vibration prevention mechanism of claim 1, consisting of:
    two wire restriction means (25, 26) which each have semi-circular cylindrical dents, and are disposed to cooperatively define, with the dents, a circular cylindrical space (28) having a diameter barely greater than the diameter of the wire for capturing the middle portion of the initial free length of the wire therein; and
    two air cylinders (23, 24) diametrically opposed to each other for displacing the respective wire restriction means fixed at the ends of the respective piston rods (23a, 24a) of the air cylinders, along a horizontal direction intersecting the wire.

3. A wire vibration prevention mechanism of claim 1, consisting of:
    one wire restriction means made up of
        an incompletely closed ring body (40a) having a vertically penetrating space defined therein which consists of a downwardly tapered truncated-conical bore (40a-1) and a vertical slit (40a-2) wider than the diameter of the wire,
        a truncated-conical body (40b) having a vertically penetrating hole (40b-1) of a diameter barely greater than the diameter of the wire passed therethrough, and adapted to fit in the truncated-conical bore (40a-1) of the ring body (40a), and
        a stopper body (41) fixed on the wire (16) at a location below the truncated-conical body and in the vicinity of the seed crystal, which stopper body has a width substantially greater than the diameter of the penetrating hole (40b-1) of the truncated-conical body; and
    one air cylinder (23) as the drive means for displacing the incompletely closed ring body (40a) of the wire restriction means which is fixed at the end of the piston rod of the air cylinder in a horizontal direction which intersects the wire.

* * * * *